(12) United States Patent
Steckner (10) Patent No.: US 7,525,311 B2
(45) Date of Patent: Apr. 28, 2009

(54) CONFIGURABLE RADIOFREQUENCY RECEIVE COIL SYSTEM FOR A MAGNETIC RESONANCE IMAGING SYSTEM

(75) Inventor: Michael Steckner, Richmond Heights, OH (US)

(73) Assignee: Hitachi Medical Systems America, Inc., Twinsburg, OH (US)

( * ) Notice: Subject to any disclaimer, the term of this patent is extended or adjusted under 35 U.S.C. 154(b) by 0 days.

(21) Appl. No.: 11/681,418

(22) Filed: Mar. 2, 2007

(65) Prior Publication Data
US 2008/0211495 A1  Sep. 4, 2008

(51) Int. Cl.
*G01V 3/00* (2006.01)
(52) U.S. Cl. .................................................. 324/318
(58) Field of Classification Search ......... 324/300–322; 600/410–435
See application file for complete search history.

(56) References Cited

U.S. PATENT DOCUMENTS

| | | | |
|---|---|---|---|
| 6,317,619 B1 * | 11/2001 | Boernert et al. | 600/410 |
| 6,591,128 B1 * | 7/2003 | Wu et al. | 600/422 |
| 6,661,227 B2 * | 12/2003 | Eggers et al. | 324/307 |
| 6,731,969 B2 * | 5/2004 | Van Vaals et al. | 600/410 |
| 6,906,518 B2 | 6/2005 | Leussler | |
| 7,218,106 B2 * | 5/2007 | Yasuhara et al. | 324/307 |
| 7,315,167 B2 * | 1/2008 | Bottcher | 324/318 |
| 7,330,030 B2 * | 2/2008 | Nakabayashi | 324/318 |
| 7,336,076 B2 * | 2/2008 | Kuhara | 324/318 |

FOREIGN PATENT DOCUMENTS

WO   WO 2005076027 A1   8/2005

* cited by examiner

*Primary Examiner*—Dixomara Vargas
(74) *Attorney, Agent, or Firm*—Ulmer & Berne LLP (57) ABSTRACT

Described herein is a radiofrequency receive coil system for a magnetic resonance imaging (MRI) system that includes an array of a plurality of individual coils arrayed around the outer limits of the imaging volume that is defined by a main magnet and a gradient coil, positioned tangentially down the length of said volume, with the plurality of individual coils each having an initial position with relation to the patient to be imaged; and mechanical support for the individual coils. The individual coils may be dynamically repositioned for optimal imaging. A further embodiment of the system includes an array of individual coils positioned radially on the vertical plane around the patient table, which may advance into the gantry before imaging. The method for use of the receive coil system is also described.

17 Claims, 6 Drawing Sheets

CONFIGURABLE RADIOFREQUENCY RECEIVE COIL SYSTEM FOR A MAGNETIC RESONANCE IMAGING SYSTEM

TECHNICAL FIELD

The invention relates generally to magnetic resonance imaging (MRI) systems, and more specifically to an infinitely configurable RF Receive coil for use with such systems.

BACKGROUND OF THE INVENTION

Magnetic resonance imaging (MRI) is a medical diagnostic imaging technique used to diagnose many types of injuries and medical conditions. An MRI system includes a main magnet for generating a main magnetic field through an examination region. The main magnet is arranged such that its geometry defines the examination region. The main magnetic field causes the magnetic moments of a small majority of the various nuclei within the body to be aligned in a parallel or anti-parallel arrangement. The aligned magnetic moments rotate around the equilibrium axis with a frequency that is characteristic for the nuclei to be imaged. An external radiofrequency (RF) field applied by other hardware within the MRI system perturbs the magnetization from its equilibrium state. Upon termination of the application of the RF pulse, the magnetization relaxes to its initial state. During relaxation the time varying magnetic moment induces a detectable time varying voltage in the receive coil. The time varying voltage can be detected by the receive mode of the transmit coil itself, or by an independent receive only coil. An image processor then reconstructs an image representation from the received magnetic resonance signals for display on a human readable display.

Figure 1:
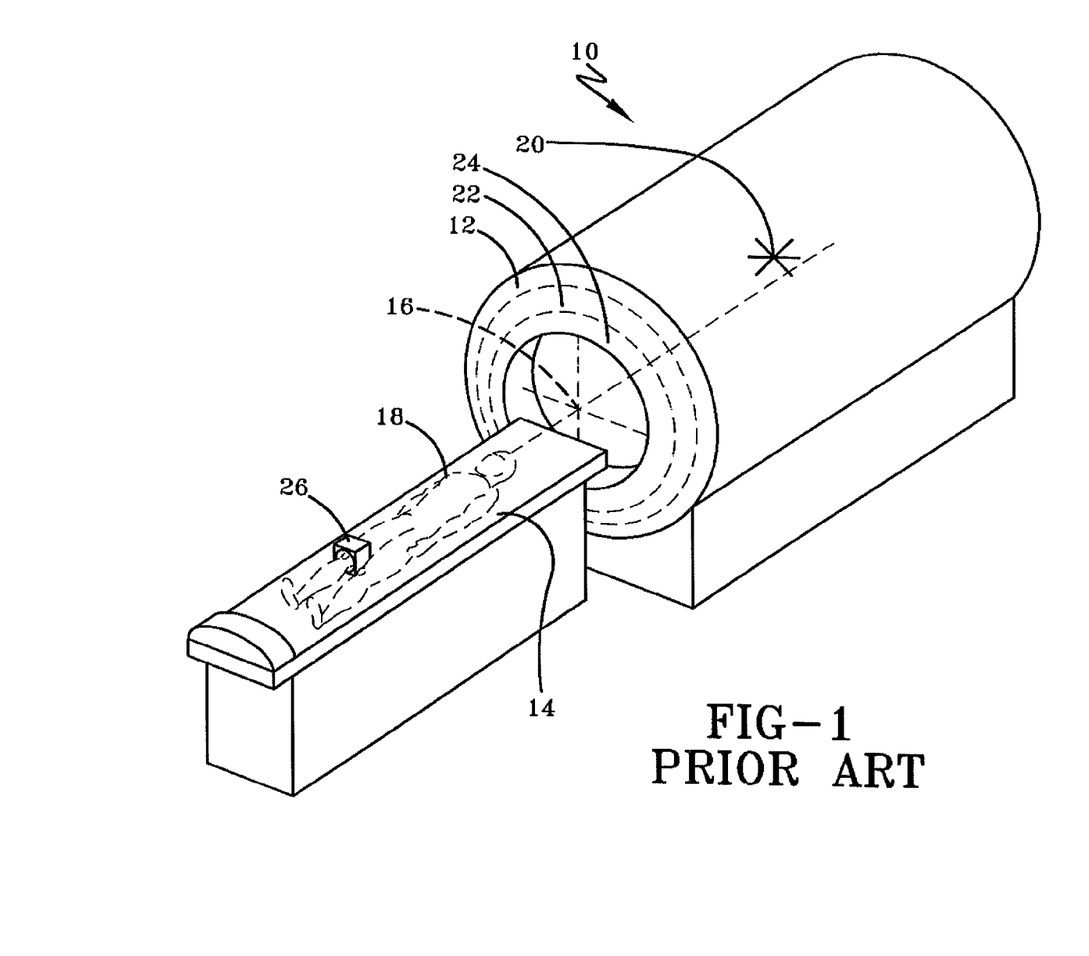
FIG. 1 is a perspective view of a magnetic resonance imaging (MRI) system of Prior Art.

MRI systems are made of many hardware components that work in conjunction with specialized software to produce the final images. FIG. 1 illustrates a MRI system of Prior Art, with the front cover removed so the main hardware components can be seen. Magnet 12 is the main hardware component of MRI system 10 and is responsible for producing the uniform main magnetic field, $B_0$. Magnets used in MRI systems are very large and can have a horizontal or a vertical magnetic field.

Patient table 14, commonly called the patient couch, extends into bore 16 of magnet 12, and exists to support and position patient 18 so patient 18 can lie comfortably during the imaging process. Couch 14 houses mechanical as well as electrical components that allow patient 18 and couch 14 to be moved to the center of the magnet bore 16, to a point called isocenter 20, where the most uniform and sensitive area of magnet 12 is located and imaging commonly occurs.

Within the volume defined by main magnet is at least one gradient coil 22. Gradient coil 22 produces substantially linear spatially varying magnetic fields within the main magnetic field that are coincidental with the direction of the main magnetic field but vary along the three orthogonal directions (x, y, z) of the Cartesian coordinate system. Radiofrequency (RF) transmit coil 24 produces a perturbing RF pulses across the examination region.

One or more RF receive coils 26, commonly called imaging coils, are typically placed within the vicinity of the patient during imaging. RF receive coil 26 detects the time varying voltages induced by the magnetic moments during the relaxation time. There are many types of RF receive coils. Volume coils are placed around the anatomy of interest of the patient, and surface coils can be placed adjacent to the anatomy of interest of the patient. Internal coils also exist, designed to image the anatomy around the outside of the coil after the coil is inserted into the patient's body. RF receive coils are commonly designed for a specific anatomy of the patient's body, for example there are coils designed to image the knee, another to image the torso, and yet another for the head. In some systems RF receive coils can also be utilized as the RF transmit coil.

Along with the type of RF receive coil used, various patient data such as the size, position, and geometry of the patient, as well as that of the anatomy of interest and any motion within those areas also affects the optimization or selection of the RF coil system. The optimal coil is selected for the specific application. The technologist also chooses the proper positioning of the coil in relation to the imaging system and the proper positioning of the patient in relation to the coil for optimal images of the anatomy of interest. It is often a time-consuming process for the technologist to choose and set up the proper RF receive coil, position the patient correctly within the coil, and position the coil and patient properly within the imaging system.

There is a need within the art for an RF receive coil system that requires minimal positioning time by the technologist for increased throughput of patients during imaging sessions. One possible solution is an RF receive coil system that can easily be configured to optimally image patients of drastically varying sizes and shapes. Another useful attribute is an RF receive coil system that is capable of imaging the entire length of a patient's body without requiring re-positioning of the patient by the technologist. A further useful attribute is an RF receive coil system that does not touch or weigh down the patient.

Current commercially available RF receive coil systems accomplish whole body coverage by covering the patient in a multi-piece coil design. The whole body coil is split into numerous sections for ease of handling by the technologist. The technologist positions the patient on the table, places the a section over the patient's head and neck, another over their upper torso and an additional section over their lower torso. The patient table is then centered at isocenter over the anatomy of interest and imaging occurs. The patient table can be later moved again for imaging at further locations of the patient's body without repositioning of the patient within the coil. While the commercially available technology satisfies the desire for full-body coverage of the RF receive coil, it raises claustrophobia concerns, as it fully encompasses the patient's body at close proximity.

SUMMARY OF THE INVENTION

The invention provides for an RF receive coil system that offers full body coverage and configures to optimally image any portion of the patient's body and dynamically reconfigure for any other part of the body, for the entire length of a patient's body, as the patient is translated through the optimal imaging volume. The RF receive coil system will include a plurality of coils or elements that adjustably configure to the unique size and shape of the patient's body structure at any point along the patient's body. The receive coil system will not require positioning or centering around solely the anatomy of interest before the patient has been advanced to isocenter of the MRI system, and will automatically position without the manual assistance of the technologist, other than to assure the receive coil system will not touch the patient's body as it translates through the magnet.

It is an object of this invention to describe an RF receive coil system that requires minimal positioning time by the technologist for increased throughput of patients during imaging sessions.

It is a further object of this invention to describe an RF receive coil system that is easily configured to optimally image patients of drastically varying sizes and shapes.

It is another object of this invention to describe an RF receive coil system that is capable of imaging the entire length of a patient's body without requiring re-positioning of the patient by the technologist.

It is yet another object of this invention to describe an RF receive coil system that positions around the patient in such a way to allow the largest possible patient to be imaged.

It is yet a further object of this invention to describe an MRI system utilizing an RF receive coil system that requires minimal positioning by the technologist, is easily configured to optimally image patients of varying sizes and shapes, and is capable of imaging the entire length of a patient's body without requiring re-positioning of the patient by the technologist.

It is an additional object of the invention to provide an RF coil system with dynamic capabilities to optimally adjust at any time to any portion of the patient's body and capable of readjusting to additional portions of the patient's body during the same scanning session.

It is a further object of this invention to provide an RF coil system that is functional without touching the patient's body at any point during translation, during adjustments, or during scanning.

For the purposes of this application, the term coil shall mean an RF coil comprised of numerous elements in individual mechanical packages, multiple elements within a single mechanical package, or an individual or single element. Also for the purposes of this application, the term RF receive coil shall encompass RF receive coils acting in a receive-only capacity, as well as RF receive coils capable of acting in a receive and transmit capacity.

The invention meets these objectives by providing a RF receive coil system including multiple coils arrayed around the isocenter of the MRI system. Each coil may be controlled by a means of repositioning the coil, such as an actuator, capable of moving the coil inwards towards the isocenter, placing the coil at a closer proximity to the patient for optimal imaging response. The coils may also be capable of being angulated or positioned on a slope to optimally accommodate portions of the patient's body that are not flat. A portion of the coils underneath the patient may be permanently located and positioned within the mechanical confines of the patient couch. The coils may also be capable of changing in size or shape to adjust for optimal imaging of the unique patient being imaged. Each or some of the coils may be capable of changing in size or shape to automatically adjust for optimal imaging, or a bank of differently sized and shaped coils may be available wherein the system would choose the optimal sized and shaped coils for imaging.

The invention also foresees an embodiment wherein the array of coils would be positioned in a bore-like fashion outside of the confines of the magnet of the MRI system. The array of coils would be brought towards and positioned in close proximity to the patient, and the patient table, patient, and array of coils would advance into the gantry of the magnet. An override feature would exist for the situation in which the array of coils was not necessary, allowing a receive coil of Prior Art to still be used when desired.

These and other objects of the present invention will become more readily apparent from a reading of the following detailed description taken in conjunction with the accompanying drawings wherein like reference numerals indicate similar parts, and with further reference to the appended claims.

BRIEF DESCRIPTION OF THE DRAWINGS

The invention may take physical form in certain parts and arrangements of parts, numerous embodiments of which will be described in detail in the specification and illustrated in the accompanying drawings which form a part hereof, and wherein.

DETAILED DESCRIPTION OF THE INVENTION

Referring now to the drawings wherein the showings are for purposes of illustrating numerous embodiments of the invention only and not for purposes of limiting the same, the figures illustrate the novel idea of an RF receive coil system that requires minimal positioning by the technologist, is easily configured to optimally image patients of varying sizes and shapes, is capable of dynamically repositioning during a single scanning session, and is capable of imaging the entire length of a patient's body without requiring repositioning of the patient by the technologist. For the purposes of this application, the term coil shall mean an RF coil comprised of numerous elements in individual mechanical packages, multiple elements in a single mechanical package, or an individual or single element.

The infinitely configurable RF receive coil system of this invention applies to any MRI system, including horizontal field systems, vertical field systems, high-field systems, low-field systems, and any strength system with any arbitrary field direction. Any MRI system using the RF receive coil system of this invention must be adapted with the correct electrical and mechanical connections to utilize the system properly. The MRI system may be designed especially to utilize the RF receive coil system, or an already designed system may be adapted for use with the RF receive coil system. The RF receive coil system of this invention can be utilized with receive-only capabilities, with receive and transmit capabilities, or a combination of having both a receive-only mode and a receive and transmit mode.

Figure 2:
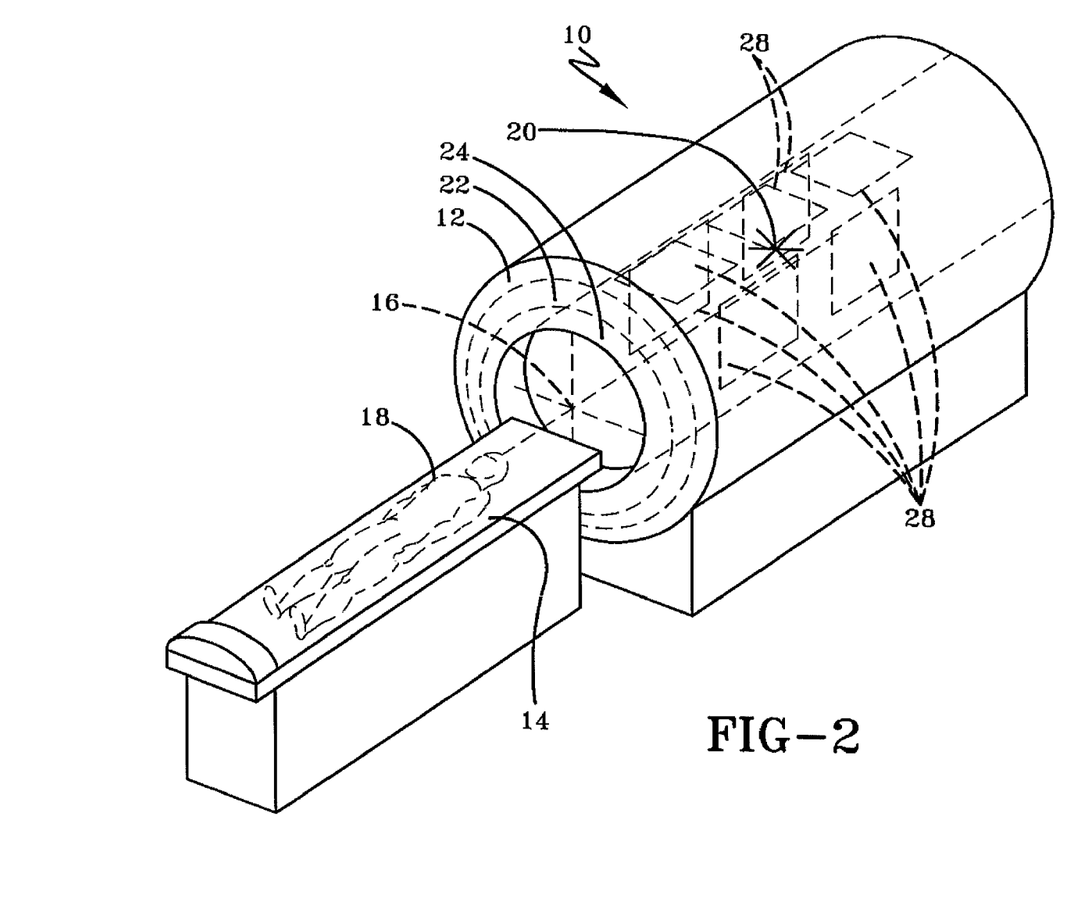
FIG. 2 is a perspective view of one embodiment of the RF receive coil system wherein the individual coils are initially positioned within the horizontal field imaging system's gantry.
Figure 3:
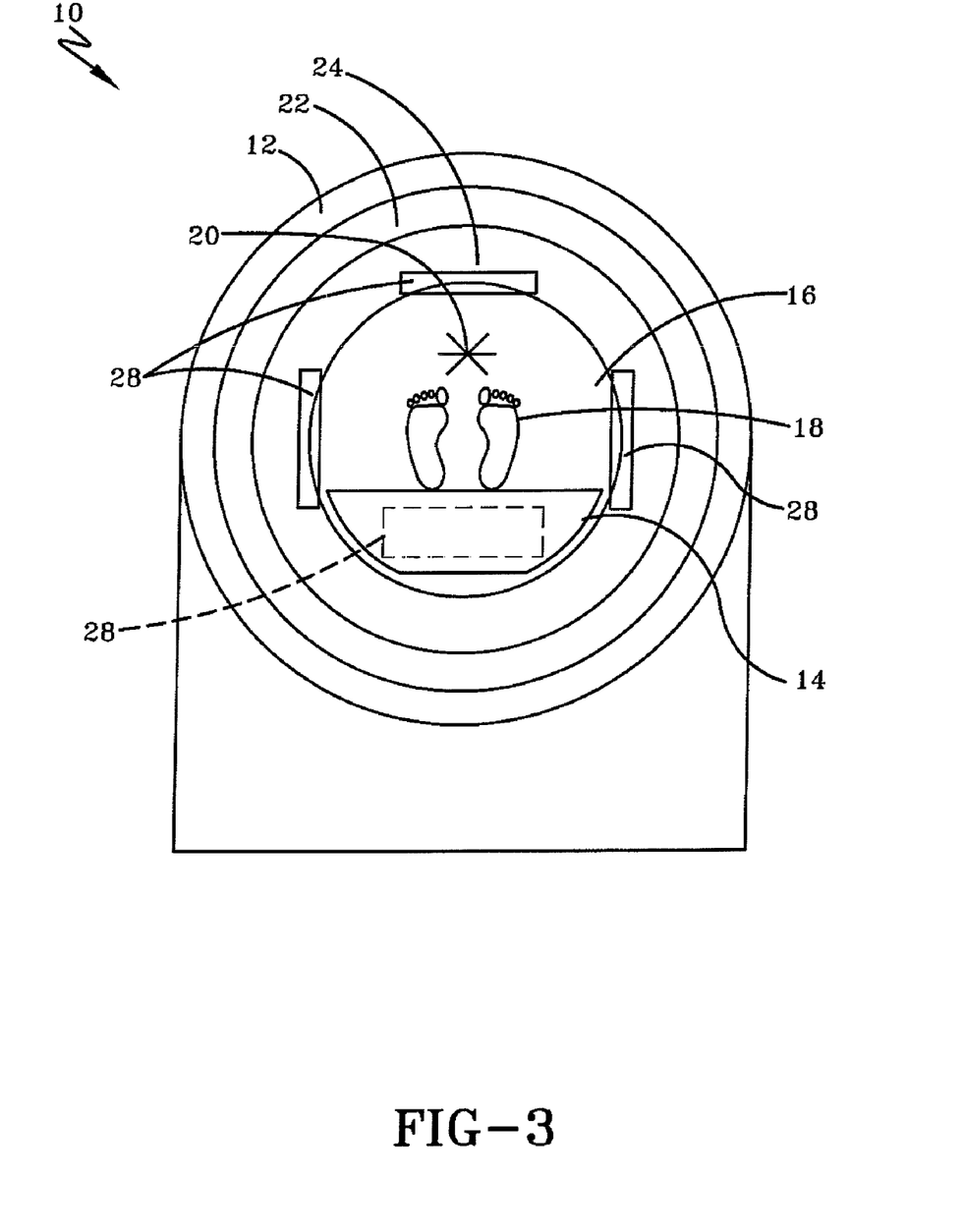
FIG. 3 is a front elevational view of the embodiment of RF receive coil system shown in FIG. 2.

One embodiment of the RF receive coil system of this invention is illustrated in FIG. 2. The front cover of MRI system 10, shown in FIGS. 2-3, has been removed so as to show the internal hardware of system 10. MRI system 10 includes main magnet 12 for providing the uniform main magnetic field. Gradient coil 22 exists within the volume created by magnet 12 and provides the essentially linear magnetic gradient field within the main magnetic field created by magnet 12. RF transmit coil 24 exists within the volume created by magnet 12 and gradient coil 22. Patient table 14 exists to support the patient and position the patient within system bore 16 (also referred to within in the art as the gantry), which is the volume created by magnet 12, gradient coil 22, and RF transmit coil 24. Patient table 14 is capable of moving from a position outside of magnet bore 16, where patient 18 is initially positioned on table 14 into bore 16 so as to position patient 18 at isocenter 20 of magnet 12 where optimal imaging occurs. Patient table 14 of FIGS. 1-2 and 4-6 are shown in a position outside of magnet bore 16, while patient table 14 of FIG. 3 is illustrated as being within magnet bore 16. RF receive coil system 28 is a plurality of coils arrayed radially around the outer limits of the imaging volume or bore 16, positioned approximately tangentially to bore 16 along the center axis running through the imaging volume. The array will commonly, but not necessarily, be centered on isocenter 20 of magnet 12.

The quantity and coverage of the individual coils may vary, with the minimum number of coils used being a single coil, however more than a single coil is suggested, as the clarity and speed of acquisition of the images will increase as the quantity of coils used increases. Generally the quantity of coils used will be the minimum number of coils necessary to give proper coverage over the entirety of the imaging volume. This quantity will depend on the dimensions of the imaging volume, the strength of the magnet of the system, the clarity of images desired, and many other characteristics known within the art.

If the quantity of coils used is larger than the number of channels available within the system to process the signals from the coils, software and methods known within the art may be utilized to combine coils or eliminate the signals from certain coils to bring the number of signals into the range able to processed by the system with its limitations. In other embodiments of the invention, the individual coils may only cover a portion of the bore and/or may have space between each individual coil. The spacing of the individual coils may be equal or unequal, as there may be a desire for the coils to be more closely spaced near isocenter of the magnet.

RF receive coil system 28 is mechanically supported within bore 16. The individual coils may be connected to and share the already existing supports of magnet 12, gradient coil 22, or RF transmit coil 24, or may have an individual means of support. Any means of mechanical support may be utilized, some non-limiting examples including cross-beams connected to an individual coil of RF receive coil system 28 at one end and to the lower portion of the mechanical cover protecting RF transmit coil 24, gradient coil 22, and magnet 12 at the opposing end, or suspension cables or beams connected to an individual coil of RF receive coil system 28 at one end and to the upper portion of the mechanical cover protecting RF transmit coil 24, gradient coil 22, and magnet 12 at the opposing end. The individual coils of RF receive coil system 28 may also be supported by extensions from a central hub that itself is supported to an aspect of the MRI system or an external environmental support such as a wall or ceiling.

In an embodiment of the invention, each coil or element of RF receive coil system 28 is controlled by a means of repositioning the coil or element, such as but not limited to an actuator, capable of moving the coils or elements from their original or initial position to a subsequent position. Any device capable of moving and repositioning the coils or elements within the imaging volume can be utilized, and examples of such devices are well known within the mechanical arts. The repositioning devices may be capable of vertical movement of the coils or elements, wherein the respective coils or elements are repositioned inwards towards the patient table, effectively decreasing the distance between patient 18 and coil system 28. Positioning the coils or elements in close proximity to the patient allows for the optimal imaging response leading to high quality clinical images. In a further embodiment, the repositioning devices may also be capable of horizontal or vertical movement of the coils or elements, wherein the respective coils or elements would be moved down the length of the patient, or sideways, as may be possible of surface coils are used. The repositioning devices may also be capable of tilting the coils to position them on an angulated plane to accommodate portions of the patient's body that are angled. The actuator or other type of repositioning device may be capable of moving the elements or coils to any location within the volume of the bore that is not occupied by another coil or element.

Horizontal movement combined with vertical movement in moving the individual coils to their subsequent position allows the coils to alter their coverage as necessary for the individual imaging session. For example, if a particular area of the abdomen is not covered, an individual coil may be repositioned to the desired vertical position for optimal imaging, as well as adjusted horizontally for coverage of the otherwise uncovered anatomy. An additional embodiment of the invention allows for the plurality of individual coils to cover the entire area of the gantry, by covering the entire circumference and length, then allowing the technologist or other automated function to choose the particular coils needed for the desired or optimal imaging. The plurality of position adjusting coils also serves the benefit of allowing a set number of coils to be infinitely configured to assume a variety of positions and locations eliminating the need for imaging sites to invest in individual coil packages of Prior Art optimized for certain body geometries.

Additional software used to sense isolation may be necessary to implement the above embodiments, as horizontal movement or picking non-consecutive or consecutive coils may cause cross-talk, signal cancellation, and other isolation difficulties. Methods of monitoring isolation, as well as avoiding cross-talk, signal cancellation, and other isolation difficulties is well known within the art, and any of a variety of methods are well known within the art and may be used to accomplish this goal.

The appropriate vertical distance the coils or elements should be moved towards the patient in the subsequent position of the coils or elements in embodiments allowing vertical movement of the individual coils may be determined in a variety of ways. The final position of the coils is dependant upon the desired distance between the coils or elements and the patient's body. Most preferably the coils or elements will be in close proximity to the patient, to ensure optimal imaging, but will make no contact with the patient. Certain embodiments of the invention may also incorporate contact sensors employed to immediately increase the distance between the coils or elements and the patient should any inadvertent contact be made between a coil or element and the patient. The positioning of the individual coils by the method of this invention will be capable of accommodating any patient that physically fits within the initial outwardly extended position of the RF receive coil system within the bore.

A non-limiting example of a technique for picking the appropriate vertical position of the coils may include obtaining an image of the patient with a large field of view with the coils or elements of the RF receive coil system in their original position, fully extended outwardly within the bore. The image processing system would be capable of processing the distance between isocenter and the outer-most point of the volume occupied by the patient's body using the large field of view image. A computer-controlled actuator would then move the coils or elements inwards towards the patient to the appropriate position as to achieve optimal imaging with the coil or elements not making contact with the patient.

In certain preferred embodiments of the invention, the coils may also be capable of changing in size or shape to adjust to the optimal imaging parameters of the unique patient being imaged. Each or some of the coils may be capable of changing in size or shape to automatically adjust for optimal imaging. The software controlling the system may determine the ideal size and shape of the coils and effectuate their reconfiguration to take on that desired size and shape. The system may then reposition the newly shaped elements on the horizontal, vertical, and angular axis to position the elements in their ideal location for optimal imaging of the patient. As a non-limiting example, an element that began with a generally circular shape may be designed to change shape such that four rounded corners form, making the shape more rectangular in nature. The shape of the elements is not limited to standard shapes or shapes currently known within the art, as it can be foreseen that asymmetrical and other unique shapes may be capable of producing optimal images in certain situations. The element may then be repositioned to the ideal position and angle within the bore of the magnet for optimal imaging of the patient.

Furthermore, in other embodiments of the invention, a bank of differently sized and shaped coils may be available, offering many different sizes and shapes of coils for use. The software controlling the system may determine and specify the optimal sized and shaped coils for each imaging session. The optimally sized and shaped elements may then be repositioned vertically, horizontally, and angularly as necessary for optimal patient imaging. As a non-limiting example, banks of large and small generally rectangular, generally circular, figure-eight, and other shape elements may exist. The software controlling the system may choose a combination of small generally rectangular and large generally circular elements are ideal for a specific patient. The software will then choose those elements, and reposition them to their ideal locations and angles to effectuate the optimal clinical images of the patient.

In certain embodiments of the invention the movable array of coils creating RF receive coil system 28 may be obstructed by patient table 14. As patient table 14 must have certain mechanics underneath to control the movement in and out of gantry 16, physical impediments may exist blocking the inward motion of the coils or elements, not allowing the lower coils to move towards patient 18. In these embodiments, the lower portion of the coils or elements may be permanently positioned preferably underneath patient table 14, more preferably within the mechanical confines of patient table 14, or most preferably on top of patient table 14, but underneath a protective cover, coating, mat, pad, or the like. Ideally, the coils will be as close as possible to the patient without making physical contact with the patient. The lower coils may also be embedded underneath the cover protecting magnet 12, gradient 22, and RF transmit coil 24.

It is foreseen by the invention, however, that the array of individual coils need not be repositioned either vertically or horizontally, and may image from the initial position in close proximity to the outer limits of the imaging volume or the system bore. Imaging without repositioning the individual coils allows the largest possible patient to be imaged within the imaging system. The time required for imaging also decreases, as the repositioning step of the method is eliminated. Rapid imaging is a benefit for imaging studies that involve a patient that cannot remain still for extended periods of time.

Figure 4:
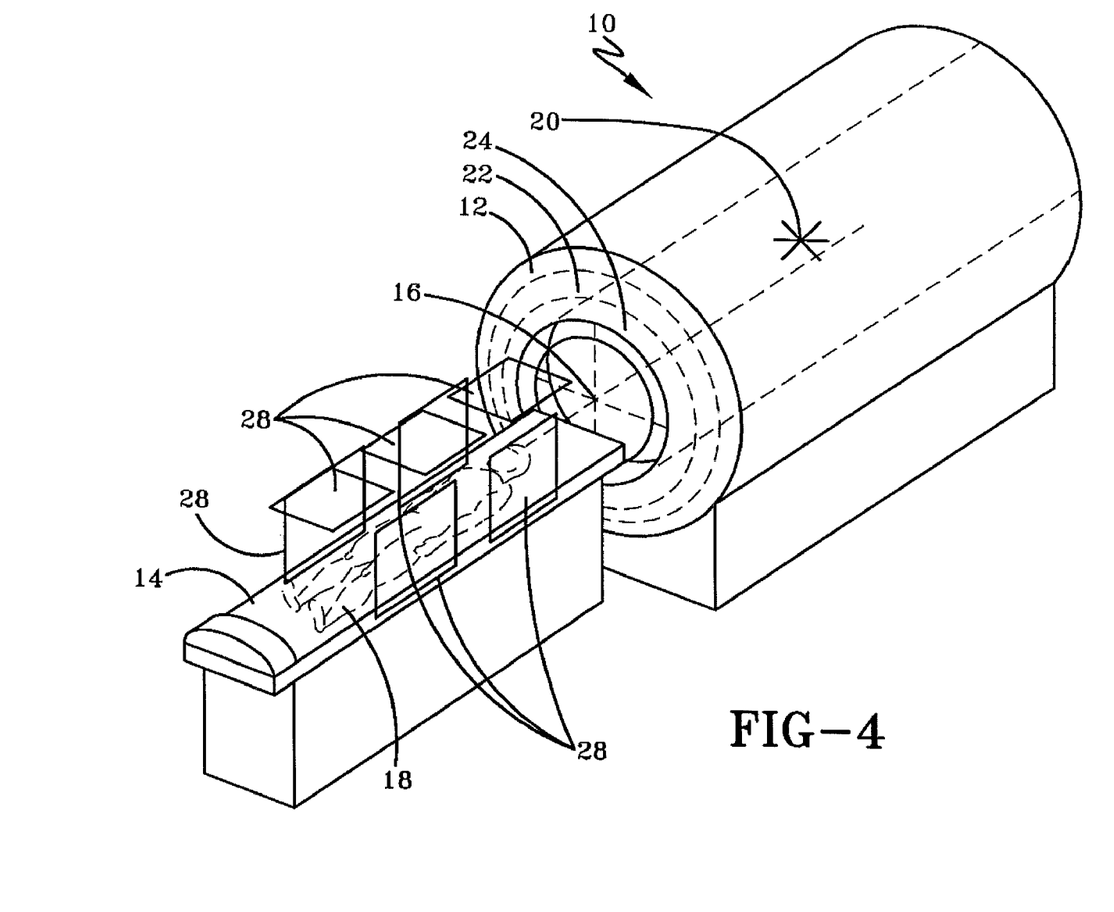
FIG. 4 is a perspective view of another embodiment of the RF receive coil system wherein the individual coils are initially positioned exterior to the horizontal field imaging system's gantry.

A further embodiment of the invention, as shown in FIG. 4, foresees RF receive coil system 28 having an initial position outside of the volume defined by main magnet 12, gradient coil 22, and RF transmit coil 24. RF receive coil system 28 would include a plurality of individual coils positioned in a gantry-type formation and mechanically supported so as to allow space for patient 18 to lie on patient table 14. Patient 18 would lie on patient table 14 and be positioned within RF receive coil system 28 at the initial position outside of bore 16. Patient table 14, with patient 18 thereon and RF receive coil system 28 around patient 18, would be moved within bore 16. The individual coils comprising RF receive coil system 28 would then be maneuvered inward towards patient 18 for optimal imaging quality. A yet further embodiment allows patient 18 to be moved into bore 16 without RF receive coil system 28. Receive coil system 28 can then be later moved into bore 16 around patient 18, repositioning of the coils occurring after system 28 is surrounding patient 18.

As with the embodiment of the invention wherein the initial position of RF receive coil system 28 is within bore 16, the embodiment wherein the initial position of RF receive coil system 28 is outside bore 16, may vary in the quantity and coverage of the individual coils. The coils may cover the entire area or just a portion of bore 16, with no, little, or much space between individual coils. The spacing of the individual coils may be equal or unequal.

One benefit of RF receive coil system 28 having an initial position external of gantry 16 includes valuable bore space will be available for situations wherein the individual RF receive coils of Prior Art would be more appropriate for imaging. The individual RF receive coil of Prior Art may be positioned in relation to patient 18 after patient 18 is positioned on patient table 14. An override function exists on RF receive coil system 28 with the initial outside bore position that would allow patient table 14 and patient 18 thereon to be moved into bore 16 without RF receive coil system 28, and imaging would utilize the coil of Prior Art.

A further embodiment of the invention combines the efficiency of locating the RF receive coil system initially interior to the space defined within the magnet bore with the flexibility of offering an override feature for when utilization of an individual RF receive coil of Prior Art is desired. RF receive coil system 28 would be initially located within the space defined by the magnet, gradient, and RF transmit coil, as illustrated in FIGS. 2-3. In the situation RF receive coil system 28 is optimal for the imaging procedure, receive coil system 28 would adjust vertically and/or horizontally for optimal imaging, and the imaging procedure would begin. In the situation RF receive coil system 28 is not optimal for the imaging procedure, and an individual RF receive coil of Prior Art is better suited, an override feature may be enabled, wherein receive coil system 28 would advance through the magnet bore to the back side of the magnet or would advance forward through the front side of the magnet bore, making room within the bore for the individual coil of Prior Art.

Figure 5:
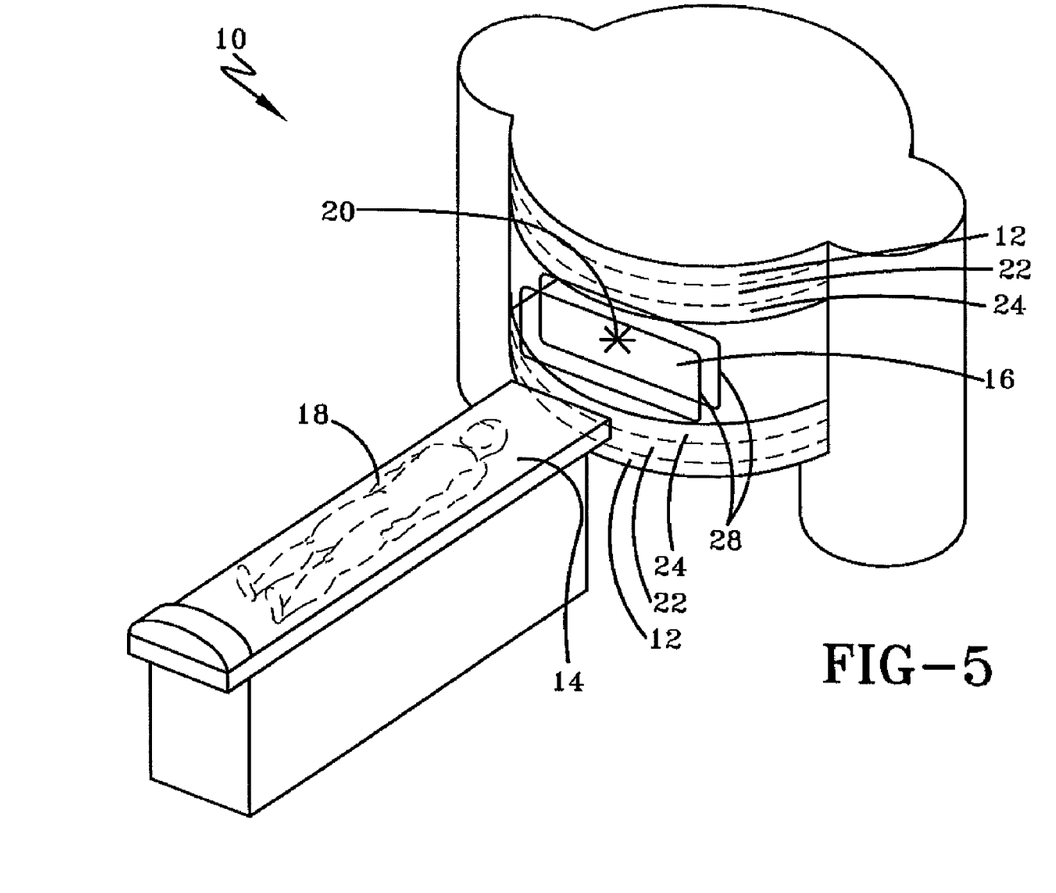
FIG. 5 is a perspective view of a further embodiment of the RF receive coil system applied to a vertical field system.
Figure 6:
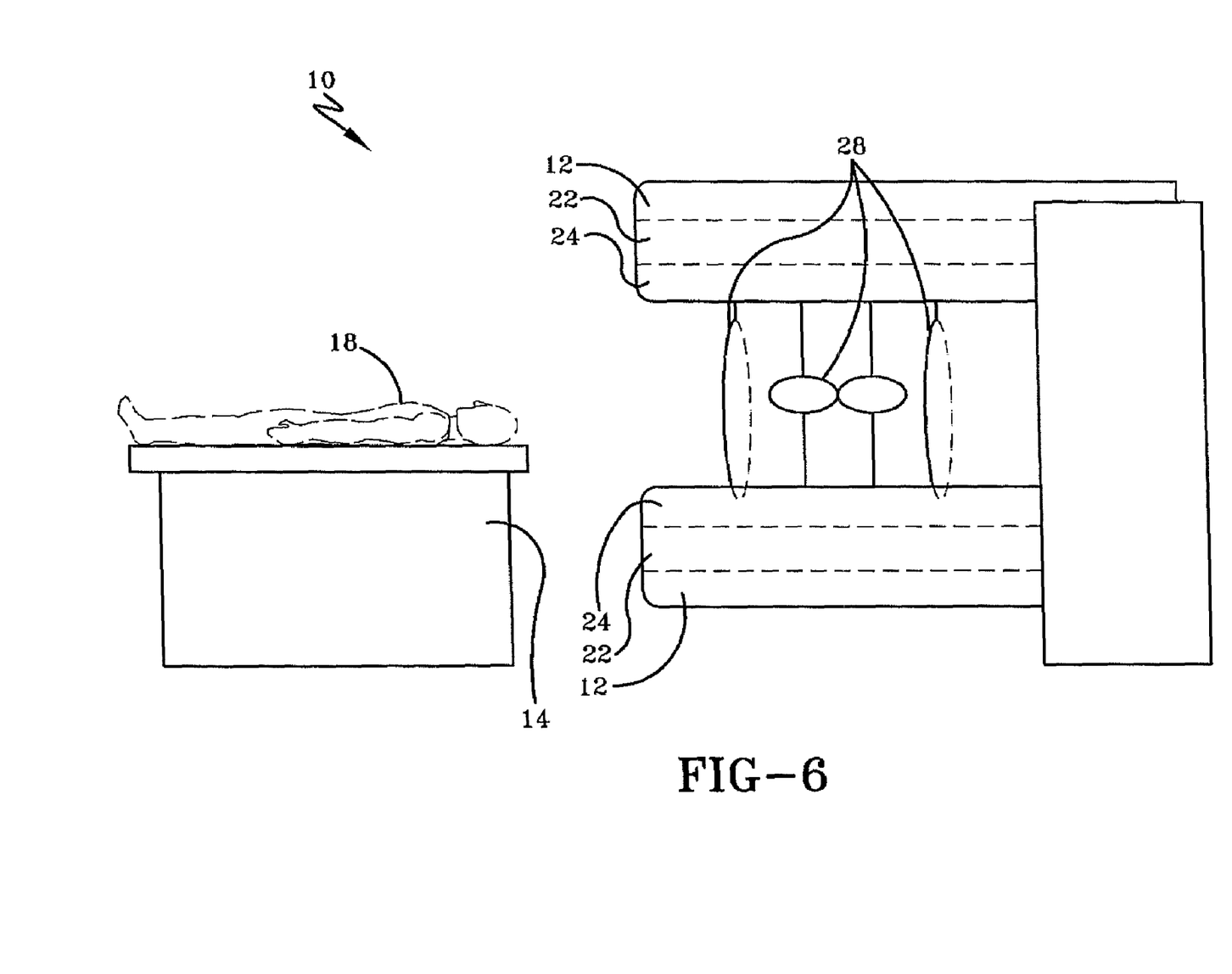
FIG. 6 is a elevational side-view of the embodiment of the RF receive coil system shown in FIG. 5.

An embodiment of the infinitely configurable RF receiver coil system implemented on a vertical field MRI system is shown in FIGS. 5-6. RF receive coil system 28 again includes numerous individual coils or elements positioned within the volume created by magnet 12, gradient coil 22, and RF transmit coil 24. The coils may be individually controlled by actuators, allowing them to be repositioned or moved towards patient 18 for optimal imaging quality. The individual coils will commonly be visible, as the sides of vertical field systems are generally open and the coils will be seen when creating a complete loop around the patient. An array of surface coils may be used to solve this aesthetic problem. Volume coils may also be used when there is a mechanism for completing the loop of the coils around the volume the patient is occupying. RF receive coil system 28 may appear as two split halves in a vertical field system, similar to the appearance of magnet 12 with a vertical magnetic field. The top and bottom half of coil system 28 must be electrically connected in some fashion, whether electrically connected within the support columns of the vertical field system, through a connection of some sort in some proximity to the patient, or through a connection on either side of the patient table. It is important to note that in FIG. 6, patient 16 and patient table 14 are shown as separated from system 10 to illustrate the alignment between patient 16 and patient table 14, and in practice would commonly, but not necessarily, be connected to system 10.

Described within this application is a radiofrequency receive coil system for a magnetic resonance imaging system which includes an array of a plurality of individual coils positioned radially around the outer limits of the imaging volume defined by the main magnet, gradient coil, and radiofrequency transmit coil, positioned consecutively down the length of that volume, with the array centered on isocenter of the magnet, and a means of mechanically supporting said individual coils within said volume. The individual coils may be repositioned horizontally or vertically for optimal imaging of the patient. A further embodiment of the receive coil system includes an array of a plurality of individual coils positioned radially on the vertical plane around the patient on the patient table, which advances into the gantry before, with, or after the patient and patient table. The magnetic resonance imaging system the receiver coil system is used with, as well as the method for using the receiver coil system is also described herein.

In the foregoing description, certain terms have been used for brevity, clearness, illustration and understanding; but no unnecessary limitations are to be implied therefrom beyond the requirements of the prior art, because such terms are used for descriptive purposes and are intended to be broadly construed. Moreover, this invention has been described in detail with reference to specific embodiments thereof, including the respective best modes for carrying out each embodiment. It shall be understood that these illustrations are by way of example and not by way of limitation.

What is claimed is:

1. A radiofrequency receive coil system for a magnetic resonance imaging system, the coil system comprising:
   (a) a plurality of individual coils arrayed around outer limits of an imaging volume that is defined by a main magnet and a gradient coil, each individual coil of said plurality of individual coils having an initial position and a subsequent position in relation to a patient to be imaged;
   (b) a means for mechanically supporting said individual coils within said volume;
   (c) a means for calculating said subsequent position of said individual coils for clinical imaging;
   (d) a means for repositioning said individual coils from said initial position to said subsequent position;
   (e) a means for overriding said means for calculating said subsequent position and said means for repositioning said individual coils; and
   (f) a means for removing each individual coil of said plurality of individual coils from within said volume upon activation of said overriding means so as to allow the use of an individual radiofrequency receiver coil.

2. The coil system of claim 1 wherein
said means for repositioning said individual coils is an actuator.

3. The coil system of claim 1 wherein
said means for calculating said subsequent position of said individual coils for clinical imaging is configured to analyze an image with a large field of view.

4. The coil system of claim 1 which further comprises:
contact sensors configured to sense physical contact between said individual coils and said patient, wherein the means for repositioning said individual coils is configured to increase the distance between said individual coils and said patient when physical contact is made between said individual coils and said patient.

5. A radiofrequency receive coil system for a magnetic resonance imaging system, the coil system comprising:
   (a) at least one individual coil arrayed on a vertical plane around a patient table, the at least one individual coil having an initial position and a subsequent position in relation to said patient table;
   (b) a means of supporting the at least one individual coil around said patient table;
   (c) a means for advancing the at least one individual coil into a volume defined by a magnet and a gradient coil;
   (d) a means for advancing said patient table into the volume defined by the magnet and gradient coil;
   (e) a means for calculating a subsequent position of said at least one individual coil with relation to said patient for clinical imaging; and
   (f) a means for repositioning the at least one individual coil from said initial position to said subsequent position wherein the coil system is configure to overwrite said means for calculating said subsequent position and said means for repositioning said at least one individual coil; and further configured to remove at least one individual coil from a plurality of individual coils within said volume upon activation of said overwriting means so as to allow the use of at least one individual radio frequency receiver coil.

6. The coil system of claim 5 wherein
the at least one individual coil advances into the volume defined by the magnet and the gradient coil simultaneously with said patient table.

7. The coil system of claim 5 wherein
the at least one individual coil advances into the volume defined by the magnet and the gradient coil non-simultaneously with said patient table.

8. The coil system of claim 5 which further comprises:
a means for overriding the means for advancing the at least one individual coil into said volume so as to allow the use of an individual radiofrequency receiver coil.

9. The coil system of claim 5 wherein
said means for repositioning the at least one individual coil is an actuator.

10. The coil system of claim 5
which further comprises:
a means of calculating said subsequent position of the at least one individual coil in relation to said patient table.

11. The coil system of claim 5 which further comprises:
contact sensors configured to sense physical contact between said individual coils and said patient, wherein the means for repositioning said individual coils is configured to increase the distance between said individual coils and said patient when physical contact is made between said individual coils and said patient.

12. A method for imaging a patient in a magnetic resonance imaging system which comprises:
   (a) positioning a patient on a patient table;
   (b) advancing said patient table such that a desired anatomy of interest of said patient is centered at an isocenter of a magnet of said magnetic resonance imaging system, the isocenter being within an imaging volume that is defined by a main magnet and a gradient coil;
   (c) advancing at least one individual coil into said imaging volume, the at least one individual coil having an initial position and a subsequent position in relation to said patient table;
   (d) calculating said subsequent position of the at least one individual coil for clinical imaging;
   (e) repositioning the at least one individual coil from said initial position to said subsequent position;
   (f) imaging the anatomy of interest of said patient to generate at least one image and (g) overwriting the step (d) of calculating the subsequent position and step (e) of repositioning the at least one individual coil; and (h) removing at least one individual coil of a plurality of individual coils from within said volume upon the execution of the step (g) of overwriting so as to allow the use of an at least one individual coil of a plurality of individual coils.

13. The method of claim 12 wherein
repositioning the at least one individual coil is accomplished using an actuator.

14. The method of claim 12 wherein
calculating said subsequent position of the at least one individual coil for clinical imaging is accomplished through analysis of the at least one image with a large field of view.

15. The method of claim 12 wherein
the at least one individual coil is originally positioned exterior to said imaging volume.

16. The method of claim 15 wherein
said patient table is advanced simultaneously with the at least one individual coil into said imaging volume.

17. The method of claim 15 wherein
said patient table is advanced non-simultaneously with the at least one individual coil into said imaging volume.

* * * * *